(12) United States Patent
Cao-Thong et al.

(10) Patent No.: US 10,411,648 B2
(45) Date of Patent: Sep. 10, 2019

(54) ELECTRONIC OSCILLATOR

(71) Applicant: EM Microelectronic-Marin SA, Marin (CH)

(72) Inventors: Tu Cao-Thong, Preverenges (CH); Mario Dellea, La Chaux-de-Fonds (CH)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 15/894,420

(22) Filed: Feb. 12, 2018

(65) Prior Publication Data

US 2018/0262160 A1    Sep. 13, 2018

(30) Foreign Application Priority Data

Mar. 10, 2017  (EP) ..................................... 17160336

(51) Int. Cl.
*H03B 5/12*    (2006.01)

(52) U.S. Cl.
CPC ......... *H03B 5/1228* (2013.01); *H03B 5/1203* (2013.01); *H03B 5/1206* (2013.01); *H03B 5/1234* (2013.01); *H03B 2200/0038* (2013.01); *H03B 2200/0082* (2013.01)

(58) Field of Classification Search
CPC .................................................. H03B 5/1228
USPC ....................................................... 331/117 R
See application file for complete search history.

(56) References Cited

U.S. PATENT DOCUMENTS

| 5,606,294 | A | 2/1997 | Richards |
| 6,384,693 | B1 * | 5/2002 | Fujidai ..................... H03B 5/08 331/117 R |
| 7,113,043 | B1 | 9/2006 | Jin et al. |
| 7,262,665 | B1 | 8/2007 | Jin et al. |
| 7,479,838 | B1 | 1/2009 | Athas |
| 7,515,000 | B1 | 4/2009 | Jin et al. |
| 7,782,149 | B1 | 8/2010 | Athas |
| 7,872,539 | B1 | 1/2011 | Athas |

(Continued)

OTHER PUBLICATIONS

European Search Report dated Sep. 4, 2017 in European Application 17160336.8, filed on Mar. 10, 2017.

*Primary Examiner* — Joseph Chang
(74) *Attorney, Agent, or Firm* — Oblon, McClelland, Maier & Neustadt, L.L.P.

(57) ABSTRACT

The present invention concerns an electronic oscillator comprising: an LC resonant circuit comprising an inductive component and a capacitive component, the LC resonant circuit being connected to a first reference voltage node and to an oscillator output node; a first transistor connected to the oscillator output node and arranged to periodically operate in a conducting state and a non-conducting state; and a phase shift circuit. A phase shift circuit output is connected to the first transistor, while a phase shift circuit input is connected by a first feedback circuit to the oscillator output node. The phase shift circuit comprises a signal phase shifter for shifting the phase of a first feedback signal from the first feedback circuit by substantially 180 degrees. The phase shift circuit further comprises a signal adder for adding a first signal from the signal phase shifter and a second signal to obtain a summed signal; and a second transistor connected to the signal adder for mirroring the summed signal to the oscillator output node through the first transistor.

14 Claims, 3 Drawing Sheets

(56) References Cited

U.S. PATENT DOCUMENTS

2002/0060613 A1    5/2002  Pao et al.
2006/0132240 A1    6/2006  Tu
2011/0193641 A1    8/2011  Clark et al.
2015/0200627 A1*   7/2015  Valdes-Garcia .... G06F 17/5063
                                                           331/8

* cited by examiner

ELECTRONIC OSCILLATOR

This application claims priority from European patent application No. 17160336.8 filed on Mar. 10, 2017, the entire disclosure of which is hereby incorporated herein by reference.

TECHNICAL FIELD

The present invention relates to an electronic oscillator. More specifically, the oscillator according to the present invention uses an LC resonant network as a part of an output power stage. The invention also relates to a method for operating the oscillator.

BACKGROUND OF THE INVENTION

An LC circuit, also called a tank circuit, resonant circuit, or tuned circuit, is an electric circuit comprising an inductive component, such as an inductor, represented by the letter L, and a capacitive component, such as a capacitor, represented by the letter C, connected in parallel, for example. The circuit can act as an electrical resonator storing energy oscillating at the circuit's resonant frequency. LC circuits are used either for generating signals at a particular frequency, or selecting a signal at a particular frequency from a more complex signal. They are key components in many electronic devices, particularly in radio equipment, used in circuits such as filters, oscillators, tuners, radio frequency (RF) modulators, sine wave generators and frequency mixers. An LC oscillator is a type of oscillator where an LC tank circuit is used for giving the required positive feedback for sustaining the oscillations. According to the Barkhausen criterion for sustained oscillations, a circuit will sustain stable oscillations only for frequencies at which the loop gain of the system is equal to or greater than 1 and the phase shift between input and output is 0 or an integral multiple of $2\pi$.

For operating a tank circuit, the capacitor is first charged to a voltage V which is the voltage source. After this, the capacitor is allowed to discharge through the inductor. The voltage across the capacitor start decreasing and the current through the inductor starts increasing. The increasing current creates an electromagnetic field around the coil (inductor) and when the capacitor is fully discharged the electrostatic energy stored in the capacitor is fully transferred into the coil as electro-magnetic field. With no more energy in the capacitor to sustain the current through the coil, the field around the coil starts to fall and the current through the coil tends to decrease. Due to electromagnetic induction, the inductor generates a back electromotive force equal to $L(di/dt)$ in order oppose the change in current. This back electromotive force starts charging the capacitor again.

When the capacitor is fully charged, the energy once stored in the inductor as electro-magnetic field has been moved to the capacitor as electrostatic field. Then the capacitor starts discharging again and the cycle is repeated. This cyclic transfer of energy between the capacitor and inductor is the reason behind the production of oscillations in the tank circuit.

Most of the LC oscillators can be categorised in the following oscillator types: Pierce oscillators, Clapp oscillators, Colpitts oscillators, transformer based oscillators, three-point oscillators (negative transconductance $g_m$) and Hartley oscillators. Today state of the art complementary metal-oxide-semiconductor (CMOS) design oscillators use negative $g_m$ based oscillators also known as differential cross-coupled negative $g_m$ oscillators.

However, the above mentioned oscillator types have some limitations. More specifically, the above mentioned oscillator types are unsuited for frequencies below GHz and/or low power/low cost transmitter applications and do not provide a particularly good output signal amplitude vs direct current power ratio.

It is an object of the present invention to overcome at least some of the problems identified above related to oscillators.

SUMMARY OF THE INVENTION

According to a first aspect of the invention, there is provided an electronic oscillator comprising:
- an LC resonant circuit comprising an inductive component and a capacitive component, the LC resonant circuit being connected to a first reference voltage node and to an oscillator output node;
- a first transistor connected to the oscillator output node and arranged to periodically operate in a conducting state and a non-conducting state; and
- a phase shift circuit, a phase shift circuit output being connected to the first transistor, while a first phase shift circuit input being connected by a first feedback circuit to the oscillator output node, and while a second phase shift circuit input being connected to a pulse shaping circuit output, whose an input is connected by a second feedback circuit to the oscillator output node, the phase shift circuit comprising a signal phase shifter for shifting the phase of a first feedback signal received from the first feedback circuit by substantially 180 degrees, wherein the phase shift circuit further comprises a signal adder for adding a first signal received from the signal phase shifter and a second signal received from the pulse shaping circuit to obtain a summed signal; and a second diode-connected transistor connected to the signal adder and forming a current mirror with the first transistor for mirroring the summed current signal to the oscillator output node through the first transistor.

The proposed new power oscillator is very efficient and minimises the power wasted in the circuit. Furthermore, the obtained oscillator can be implemented with only a very few new components. it is also possible to easily integrate a pulse shaping circuit to the oscillator. In this manner it would be possible to digitally and precisely control the oscillation amplitude for instance. This further means that the generation of unwanted harmonics (decreasing the power efficiency) can be avoided.

According to a second aspect of the invention, there is provided a method for operating the oscillator according to the first aspect method of operating the oscillator.

Other aspects of the invention are recited in the dependent claims attached hereto.

BRIEF DESCRIPTION OF THE DRAWINGS

Other features and advantages of the invention will become apparent from the following description of a non-limiting example embodiment, with reference to the appended drawings, in which.

DETAILED DESCRIPTION OF THE INVENTION

Figure 1:
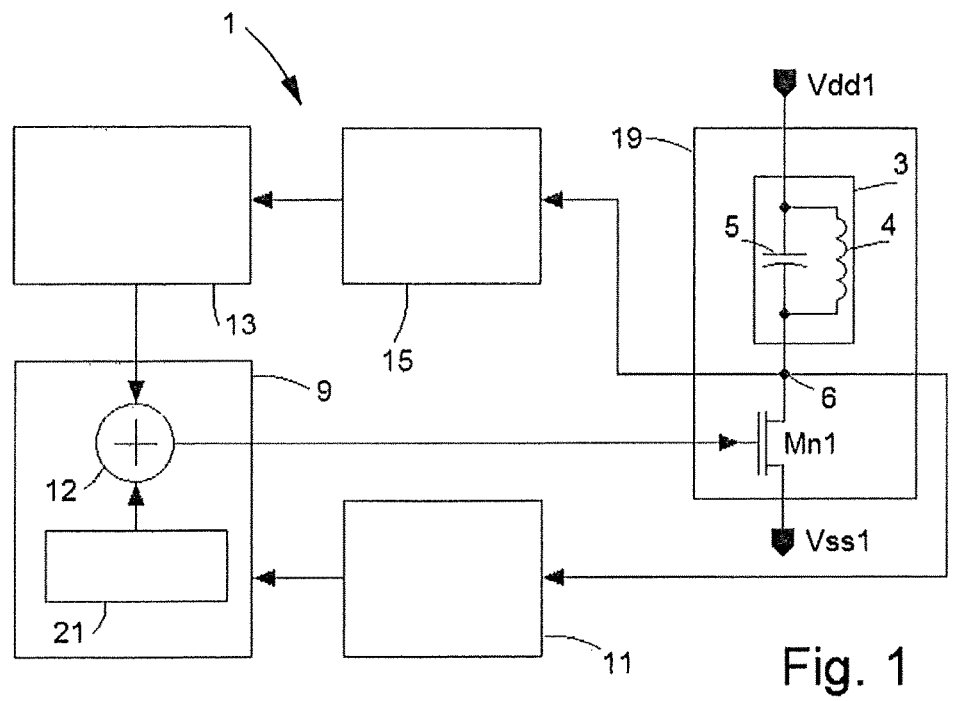
FIG. 1 is a simplified block diagram illustrating the oscillator circuit according to one example of the present invention.

An embodiment of the present invention will now be described in detail with reference to the attached figures. The invention will be described in the context of a digitally controlled power oscillator mainly implemented by n-type metal-oxide-semiconductor NMOS logic using n-type field effect transistors. However, the invention is not limited to the described solution. For example, instead of using the NMOS logic, the invention could be implemented by using P-type metal-oxide-semiconductor logic. Furthermore, the described LC circuit is merely one example of many possible LC circuit implementations. Identical or corresponding functional and structural elements which appear in different drawings are assigned the same reference numerals.

Figure 2:
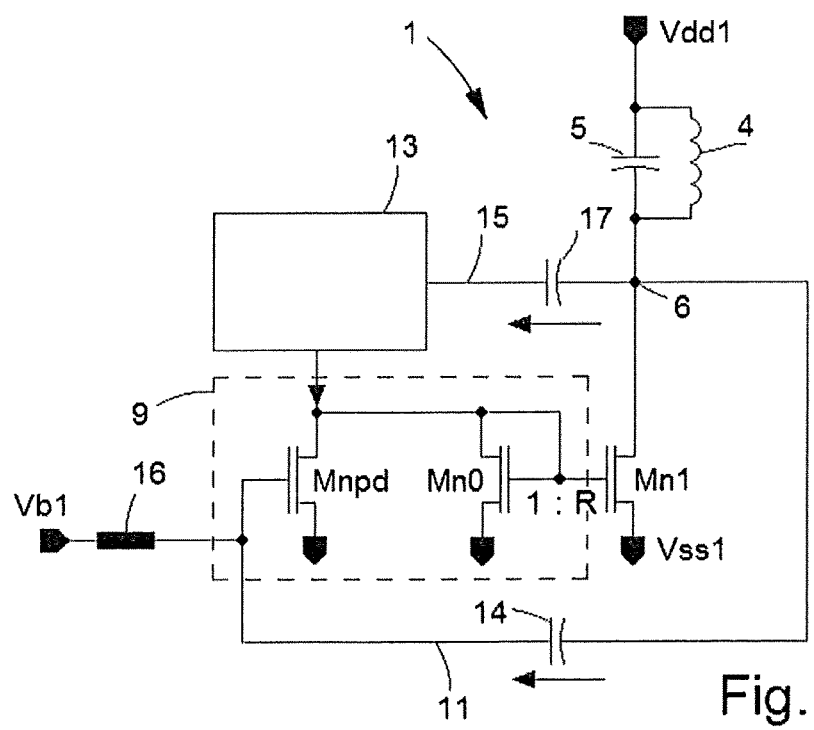
FIG. 2 is a simplified block diagram illustrating the oscillator circuit of FIG. 1, but illustrating the phase shift circuit in more detail.

FIG. 1 shows a block diagram illustrating a simplified example of an LC oscillator circuit 1 or oscillator for short according to an embodiment of the present invention. The block diagram of FIG. 2 shows the same LC oscillator circuit but in a slightly detailed manner. As shown in the figures, the oscillator circuit comprises an LC circuit 3 comprising an inductive component, in this example an inductor 4, and a capacitive component, in this example a first capacitor 5, connected in parallel in this example. A first node of the LC circuit 3 is connected to a first reference voltage node Vdd1, in this example a first voltage supply. A second node of the LC circuit 3 is connected to an output node 6 of the oscillator circuit 1. The output node 6 is also connected to a first transistor (in this example an NMOS transistor) referred to as a transistor Mn1. The source terminal of the transistor Mn1 is connected to a second reference voltage node Vss1, which in this example is the ground, while the drain terminal is connected to the output node 6. The gate terminal of the transistor Mn1 is connected to an output of a phase shift and control circuit 9, referred to simply as a phase shift circuit, and more specifically to a second transistor Mn0. A first input of the phase shift circuit 9 is connected through a first feedback circuit 11 to the output node 6 of the oscillator circuit 1. The phase shift circuit 9 comprises a phase shifter 21 arranged to shift the phase of a first feedback signal (voltage waveform) received from the first feedback circuit 11 as explained later in more detail. The phase shift circuit 9 further comprises a signal adder 12 for adding signals as explained later in more detail. The phase shift circuit is an active circuit since it comprises active circuit components, such as transistors as explained later, which consume power.

Figure 3:
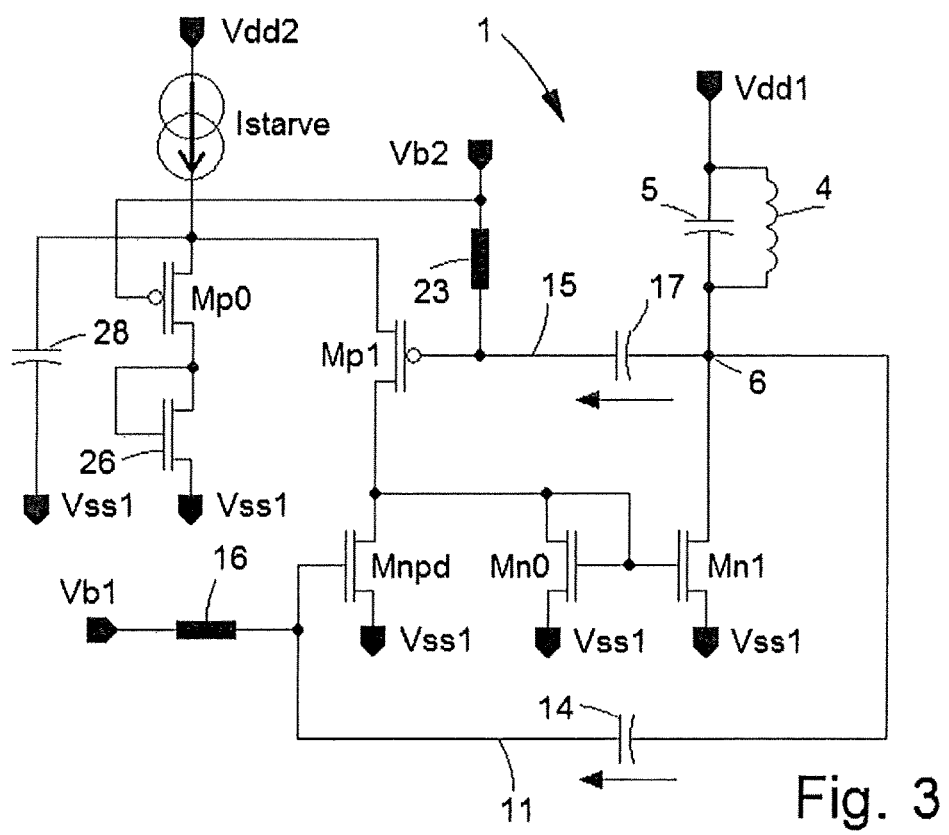
FIG. 3 is a simplified block diagram illustrating the oscillator circuit of FIG. 2, but illustrating a pulse shaping circuit in more detail.

The oscillator circuit 1 optionally also comprises a current starve pulse shaper 13, referred to as a pulse shaping circuit 13, for shaping a second input signal (current) of the phase shift circuit 9. Also the pulse shaping circuit 13 comprises active components as explained later in more detail. The pulse shaping circuit 13 at its input receives a second feedback signal from a second feedback circuit 15 which is connected to the oscillator output node 6. The output of the pulse shaping circuit 13 is connected to the signal adder 12 of the phase shift circuit 9. As shown in FIG. 3, the pulse shaping circuit 13 is also connected to a third reference voltage node Vdd2 which in this example is a second supply voltage. The second supply voltage may be the same as the first supply voltage or it may be different.

The first and second feedback circuits 11, 15 both receive at their respective input the oscillator output signal, which is a voltage waveform. The first and second feedback circuits may apply the same or different scaling factors to the oscillator output signals before feeding the first and second feedback signals (voltage waveforms), respectively, to the phase shift circuit 9 and the pulse shaping circuit 13, respectively. Scaling of the amplitude of the oscillator output signal may be needed in order to obtain scaled (amplitude reduced) first and second feedback signals. In this manner it is possible to protect the phase shift circuit 9 and/or the pulse shaping circuit 13 from any damage caused by too large first and second feedback signals. In FIGS. 2 and 3, the first feedback circuit 11 is simply approximated by a first feedback capacitor 14, while the second feedback circuit 15 is approximated by a second feedback capacitor 17. The first feedback circuit 11 is also connected to a first biasing voltage source Vb1 through a first resistor 16.

In the present embodiment, a power stage 19 of the oscillator circuit 1 comprises the LC circuit 3 and the transistor Mn1 connected in series. As a matter of fact, without the first feedback circuit 11 and the phase shift circuit 9, the power stage would operate as a power amplifier, but thanks to the first feedback circuit 11 and the phase shift circuit 9, the power stage can be transformed into an oscillating structure. Since there is a signal phase shift of substantially 180 degrees (a first phase shift) between the gate and drain terminals of the transistor Mn1, the phase shift circuit 9 needs to shift the phase of the first feedback signal by further 180 degrees (a second phase shift). In this manner the total phase shift of 360 degrees can be obtained, which is required to maintain the oscillations. The second phase shift can be obtained by a third transistor, referred to as a transistor Mnpd (n-channel pull-down transistor) acting as the phase shifter 21. More specifically, there is a signal phase shift of 180 degrees between the gate terminal (the input of the phase shift circuit 9) and the drain terminal (connected to the gate terminal of the transistor Mn1) of the transistor Mnpd. The source terminal of the transistor Mnpd is connected to ground in this example.

As shown in FIG. 2, in this example the phase shift circuit 9 further comprises the second transistor, referred to as a transistor Mn0, connected in parallel with the transistor Mnpd. The drain terminal of the transistor Mn0 is connected to the drain terminal of the transistor Mnpd, while the gate terminal of the transistor Mn0 is connected to its drain terminal and to the gate terminal of the transistor Mn1. The source terminal of the transistor Mn0 is connected to ground in this example. Since the gate and drain terminals are directly connected to each other, the transistor Mn0 is in this example a diode-connected transistor. In this example, the transistor Mn0 forms together with the transistor Mn1 a 1 to R current mirror, where R is a multiplication or scaling factor. This factor is chosen so that the extra power consumption due to the phase shift circuit 9 can be kept small. Typical values for R are between 20 and 50, or more specifically between 30 and 40. By using these values, the efficiency of the oscillator circuit 1 would be degraded by only about 2.5-3% (1/R). The signal adder 12 is in this example a current adder and is arranged to sum or add currents it receives. In the following, the signal adder 12 is simplified by a circuit node corresponding to the drain terminal node of the transistors Mnpd and Mn0. The gate terminals of the transistors Mn0 and Mn1 are also connected to this circuit node.

The above-described LC oscillator concept is very different from Pierce, Hartley, Colpitts or negative $g_m$ implementations because the proposed solution aims to leave a minimum number of components in series with the LC circuit 3 in order to minimise active power loss and therefore to maximise efficiency. As can be seen in FIGS. 1 to 3, in this example only the transistor Mn1 is in series with the LC circuit 3. It is to be noted, when considering the total power consumed by the oscillator circuit 1, it is desirable that as much as possible of the total power is consumed by the LC circuit 3. Thus, to improve efficiency, for example the power consumption of the phase shift circuit 9 and the transistor Mn1 should be minimised. All other active components shown in FIGS. 1 to 3 are separated or in parallel to the LC circuit 3.

The main gain stage of the oscillator circuit 1 is in this example implemented by the transistor Mn1. The oscillator Barkhausen criterion is met by the addition of the above-mentioned 180 degree phase shift circuit 9, which has two functions:

1. change the sign of the first feedback signal from the first feedback circuit 11 (phase criterion); and
2. implement a small signal amplification for the oscillation to start (loop gain criterion).

As mentioned earlier, the pulse shaping circuit 13 is directly connected to the phase shift circuit 9. It is possible to control the pulses in various manners. Since the transistors Mn0 and Mn1 form a 1:R current mirror, a current waveform injected into the transistor Mn0 by the pulse shaping circuit 13 is multiplied R times at the output stage (the transistor Mn1). The pulse shaping circuit 13 can generate various types of oscillator current stimuli during oscillation. The pulse shaping circuit 13 can generate for instance conventional class B pulses, more efficient class C or digitised current class D waveforms, allowing to optimise the power consumption of the solution.

The block diagram of FIG. 3 illustrates the pulse shaping circuit 13 in more detail. The second feedback signal (voltage signal) from the second feedback circuit 15 is fed to a gate terminal of a fourth transistor, referred to as a transistor Mp1. The second feedback signal is also fed through a second resistor 23 to a gate terminal of a fifth transistor, referred to as a transistor Mp0. The gate of the fifth transistor Mp0 is biased with a DC voltage source Vb2, which biased the gate of the fourth transistor Mp1 through the second resistor 23, which is also connected to a second biasing voltage source Vb2. The transistors Mp0 and Mp1 may be substantially the same or they may be different. In this example, the transistors Mp0 and Mp1 are both p-type MOSFET transistors. A drain terminal of the transistor Mp0 is in this example connected to a sixth transistor 26 which is a diode-connected transistor. However, the drain of the terminal of the transistor Mp0 could instead be directly connected to ground. The source terminals of the transistors Mp0 and Mp1 are both connected to a power source which in this example is a current source Istarve. The current source Istarve is a controllable current source such that the current signal (eg its amplitude) resulting form this source may be adjusted for example digitally. Thus, this current source may be called a programmable current source. The amplitude of the current from the current source Istarve indirectly defines the amplitude of the oscillations of the oscillator circuit 1. A drain terminal of the transistor Mp1 is connected to the signal adder 12, which is a current adder in this embodiment. A third capacitor 28 is connected between ground (earth) and the source terminals of the transistors Mp0 and Mp1.

The operation of the oscillator circuit 1 is described next in more detail. The operation of the oscillator circuit 1 can be divided into two phases: a start-up phase during which the oscillation amplitude still increases; and a steady state operation phase during which the oscillation amplitude remains substantially constant. At the beginning, during the start-up phase, the oscillation amplitude is zero and the pulse shaping circuit 13 injects current into the transistor Mn0. The transistor Mn1 mirrors the current through the transistor Mn0 and injects a step current into the tank 3 (LC circuit). The oscillation signal starts to build up and the oscillation signal (voltage signal) is fed back to the first and second feedback circuits 11, 15. After the start-up phase, during a steady state phase, the transistor Mnpd periodically turns on and off as a pull down during a half a period of the oscillation cycle. When the transistor Mnpd is on, it turns off the gate terminal of the transistor Mn1 as a pull down and enables during the other half a period (when the transistor Mnpd is off) of the oscillation cycle the signal from the pulse shaping circuit 13 to appear at the transistor Mn1. In other words, when the transistor Mnpd is off ie non-conductive, the transistors Mn0, Mn1 and Mp1 are on, ie conductive, and when the transistor Mnpd is on, the transistors Mn0, Mn1 and Mp1 are off, which means that the current at the transistor Mn1 is substantially zero. It is to be noted that during the start-up phase, the transistor Mp0 is conductive and some of the current from the current source Istarve flows through the transistor Mp0. However, during the steady state operation of the oscillator circuit 1, there is no current through the transistor Mp0 (ie the transistor Mp0 is non-conductive), and all the current from the current source Istarve flows though the transistor Mp1.

The second feedback signal allows during the phase when the transistor Mnpd is off, to use the oscillation to generate the synchronous feedback current pulse of the pulse shaping circuit 13 to support the oscillation cycle. This is known as a large signal current shaping in the CMOS power amplifier theory. It is to be noted that the size of the transistor Mp1, the current source Istarve and the second feedback signal affect the shape of the signal waveforms fed to the phase shift circuit 9. During the steady state operation, the gate of the transistor Mp1 sees a large signal input from the LC circuit 3. The average source voltage of the transistor Mp1 may be filtered by the second capacitor 28. This allows the production of current pulses by the second capacitor 28 whenever the gate voltage of Mp1 is lower than the voltage at capacitor 28 by a threshold voltage Vth. Thus, the current signal fed by the pulse shaping circuit 13 to the signal adder 12 may originate from the second capacitor 28 and/or the current source Istarve, which may be constantly on during the steady state operation of the oscillator circuit 1. The average current of the transistor Mp1 is given by the current from the current source Istarve. Thus, the current source Istarve controls the output amplitude of the oscillator since on average the direct current through the transistor Mn1 substantially equals direct current through the transistor Mn0 multiplied by R ensuring that no over saturation of the oscillation happens.

Figure 4:
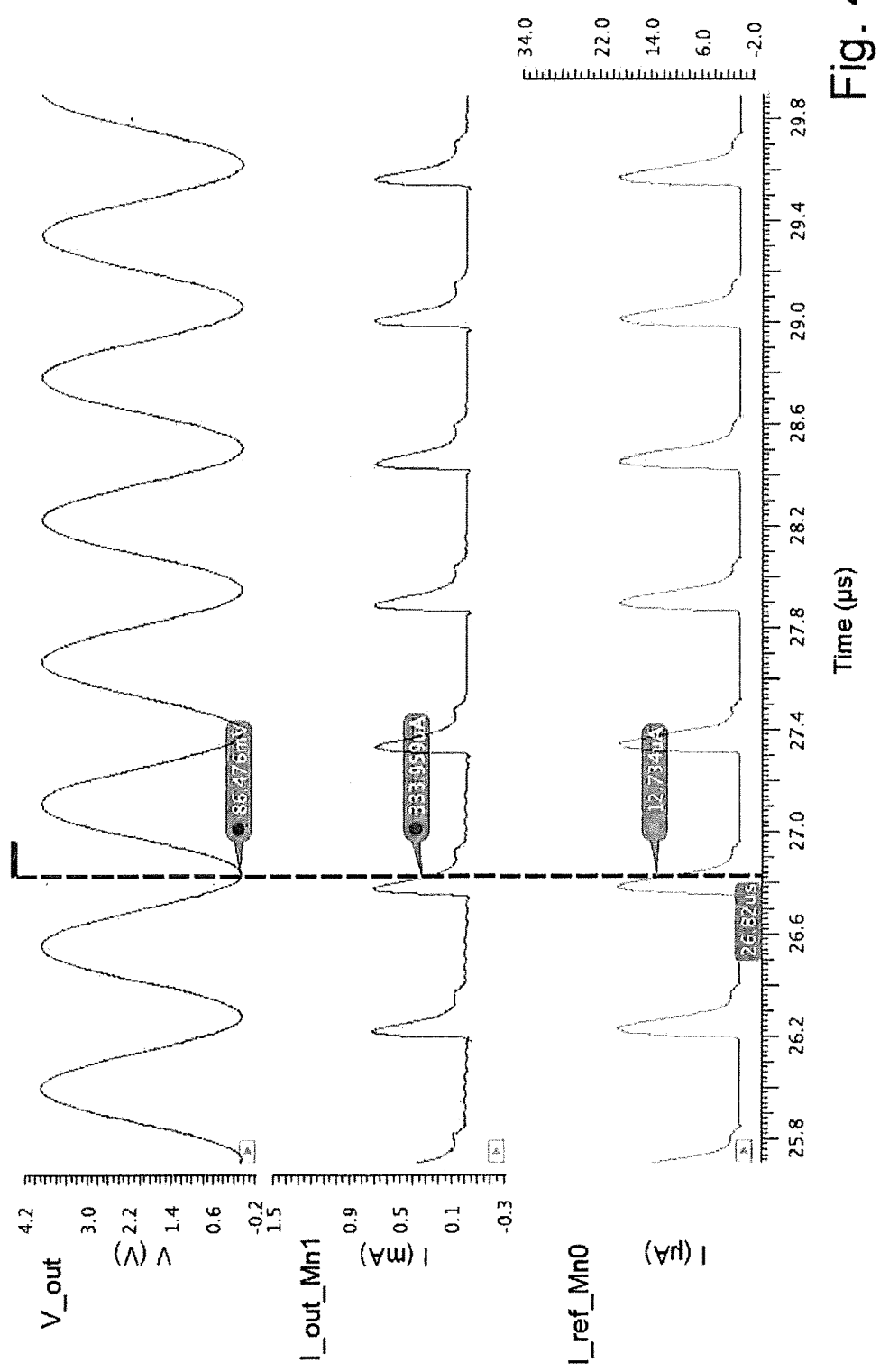
FIG. 4 is a diagram illustrating some example signal waveforms measured in the oscillator circuit of FIG. 3.

FIG. 4 shows some example signal waveforms measured during the steady state operation in the oscillator circuit 1 of FIG. 3. The uppermost graph of FIG. 4 illustrates the output voltage waveform measured at the oscillator output node 6. The graph in the middle shows the output current of the transistor Mn1, ie the drain current. The lowest graph in FIG. 4 shows the drain terminal current of the transistor Mn0. The very sharp pulses are provided by the second capacitor 28, while the average value, which is much lower than the peak, is given by the current source Istarve. It can further be noticed that the output current of the transistor Mn1 has a very narrow conduction angle (the portion of a full cycle when the current is above zero) used to optimise power efficiency.

While the invention has been illustrated and described in detail in the drawings and foregoing description, such illustration and description are to be considered illustrative or exemplary and not restrictive, the invention being not limited to the disclosed embodiment describing the electronic oscillator 1 having a controllable output signal amplitude and/or waveform. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

What is claimed is:

1. An electronic oscillator comprising:
   an LC resonant circuit comprising an inductive component and a capacitive component, the LC resonant circuit being connected to a first reference voltage node and to an oscillator output node;
   a first transistor connected to the oscillator output node and arranged to periodically operate in a conducting state and a non-conducting state; and
   a phase shift circuit, a phase shift circuit output being connected to the first transistor, while a first phase shift circuit input being connected by a first feedback circuit to the oscillator output node, and while a second phase shift circuit input being connected to an output of a pulse shaping circuit, whose input is connected by a second feedback circuit to the oscillator output node, the phase shift circuit comprising a signal phase shifter for shifting the phase of a first feedback signal received from the first feedback circuit by substantially 180 degrees, wherein the phase shift circuit further comprises a signal adder for adding a first signal received from the signal phase shifter and a second signal received from the pulse shaping circuit to obtain a summed signal; and a second diode-connected transistor connected to the signal adder and forming a current mirror with the first transistor for mirroring the summed current signal to the oscillator output node through the first transistor.

2. The oscillator according to claim 1, wherein the first transistor and the second transistor form a current mirror arranged to multiply the summed current signal by a given factor.

3. The oscillator according to claim 2, wherein the given factor is between 20 and 50.

4. The oscillator according to claim 1, wherein the phase shifter comprises a third transistor.

5. The oscillator according to claim 4, wherein the third transistor is a pull down transistor arranged to pull its output signal to ground.

6. The oscillator according to claim 4, wherein, during a steady state operation phase of the oscillator, the third transistor is arranged to periodically turn on and off the first transistor and the second transistor.

7. The oscillator according to claim 6, wherein a duration of both on and off cycles is substantially a half of an oscillation cycle.

8. The oscillator according to claim 1, wherein the pulse shaping circuit connected to the signal adder, which is a current adder, is arranged to shape the second current signal to allow controlling an oscillator output signal amplitude and/or waveform.

9. The oscillator according to claim 8, wherein the pulse shaping circuit comprises a first current source.

10. The oscillator according to claim 9, wherein the pulse shaping circuit comprises a fourth transistor and a fifth transistor, the fourth transistor and the fifth transistor having a common node connected to the first current source, and at least a portion of a first current signal from the first current source is arranged to be fed to the current adder through the fourth transistor.

11. The oscillator according to 10, wherein the fifth transistor is arranged to be off during a steady state operation phase of the oscillator allowing all the first current from the first current source to be fed to the current adder through the fourth transistor.

12. The oscillator according to claim 10, wherein a second feedback circuit is connected from the oscillator output node to the fourth transistor for feeding a second feedback signal to the fourth transistor.

13. The oscillator according to claim 10, wherein the pulse shaping circuit comprises a capacitor for filtering a voltage over the fourth capacitor and for providing a second current signal to be fed to the current adder through the fourth transistor.

14. A method of operating the oscillator according to claim 1.

* * * * *